(12) United States Patent
Teshirogi et al.

(10) Patent No.: US 7,655,505 B2
(45) Date of Patent: Feb. 2, 2010

(54) MANUFACTURING METHOD OF SEMICONDUCTOR DEVICE

(75) Inventors: Kazuo Teshirogi, Kawasaki (JP); Yuzo Shimobeppu, Kawasaki (JP); Kazuhiro Yoshimoto, Kawasaki (JP); Yoshiaki Shinjo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 418 days.

(21) Appl. No.: 11/437,606

(22) Filed: May 22, 2006

(65) Prior Publication Data

US 2007/0196954 A1 Aug. 23, 2007

(30) Foreign Application Priority Data

Feb. 17, 2006 (JP) ............................. 2006-041025

(51) Int. Cl.
*H01L 21/00* (2006.01)
(52) U.S. Cl. ...................... 438/113; 257/620
(58) Field of Classification Search ................ 438/113; 257/620
See application file for complete search history.

(56) References Cited

U.S. PATENT DOCUMENTS 5,830,807 A 11/1998 Matsunaga et al.

FOREIGN PATENT DOCUMENTS

| JP | 2004-172249 | 6/2004 |
| JP | 2004-296738 | 10/2004 |
| TW | 511256 B | 11/2002 |
| TW | 544887 B | 8/2003 |

OTHER PUBLICATIONS

Translation of TW 544887—Aug. 1, 2003.*
Taiwanese Office Action dated Nov. 4, 2008 (mailing date), issued in corresponding Taiwanese Reference No. 09720591850.
Taiwanese Office Action dated Mar. 27, 2008 (date of receipt) reference No. 09720156970, issued in corresponding Taiwanese Patent Application No. 095118094 filed May 22, 2006 and English translation.

* cited by examiner

*Primary Examiner*—W. David Coleman
*Assistant Examiner*—Sonya D McCall-Shepard
(74) *Attorney, Agent, or Firm*—Westerman, Hattori, Daniels & Adrian, LLP

(57) ABSTRACT

A manufacturing method of a semiconductor device, includes i) a step of providing a transparent member above a main surface of a semiconductor substrate where a plurality of semiconductor elements is formed; ii) a first dividing step of dividing the transparent member corresponding to a designated area of the semiconductor element; iii) a second dividing step of dividing the transparent member corresponding to an external configuration of the semiconductor element; and iv) a dividing step of dividing the semiconductor substrate into the semiconductor elements corresponding to a dividing position of the transparent member.

5 Claims, 11 Drawing Sheets

FIG.10
(A)
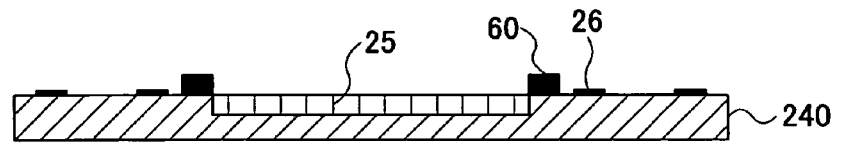
(B)
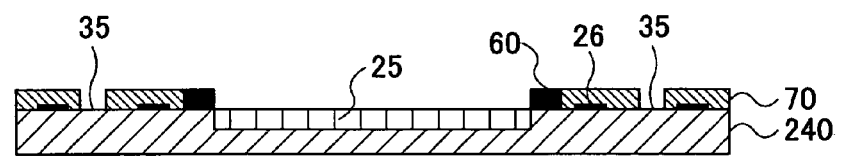
(C)
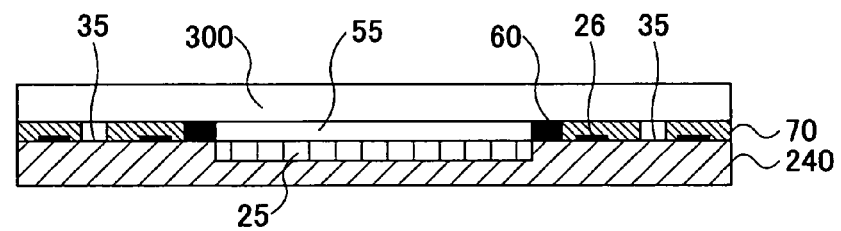
(D)
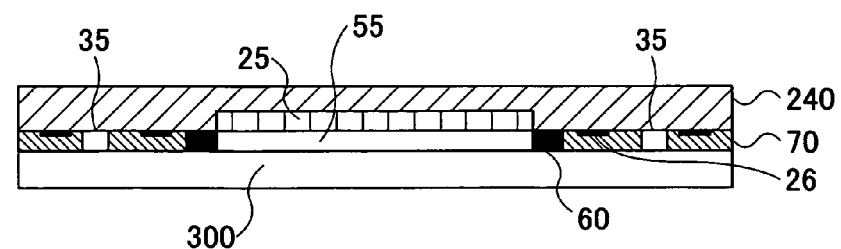

FIG.12
(I)
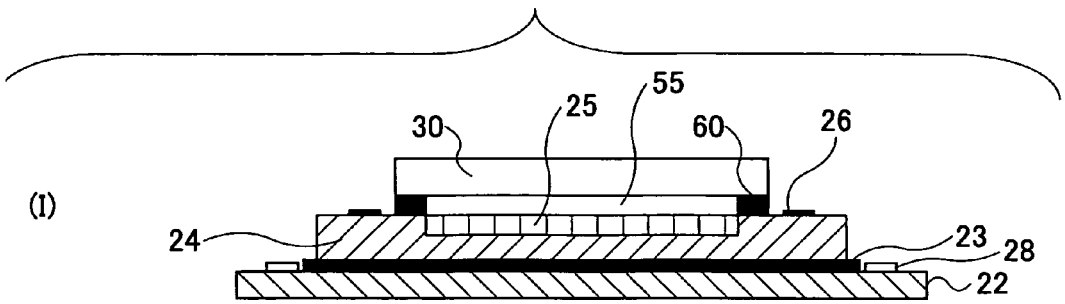
(J)
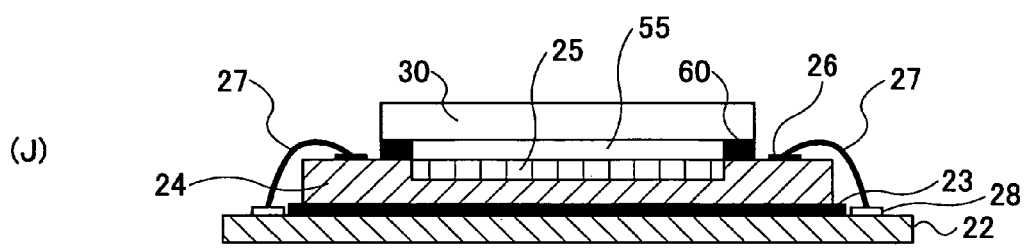
(K)
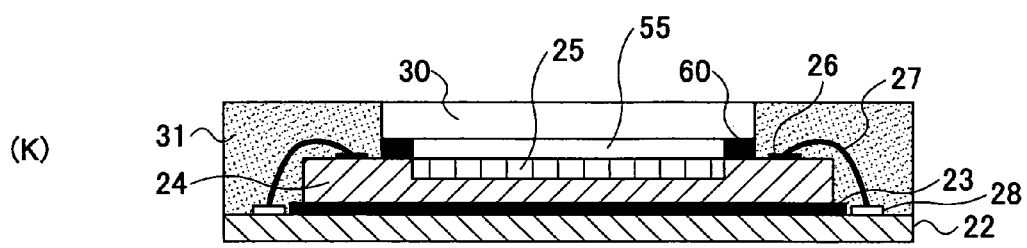
(L)
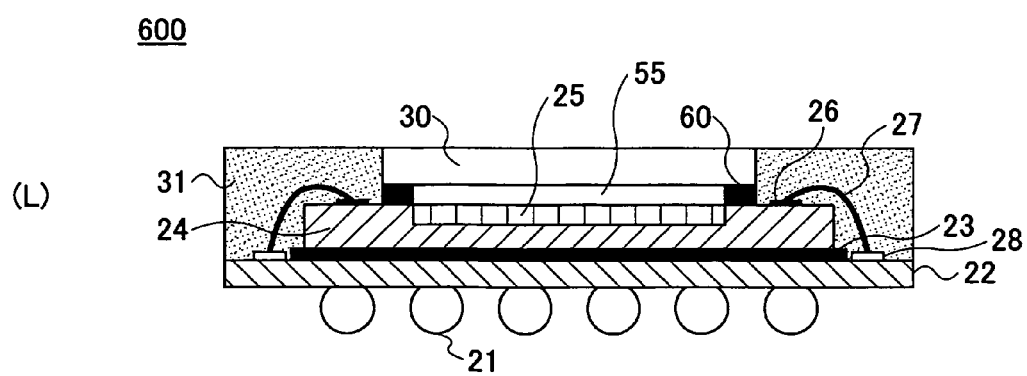

MANUFACTURING METHOD OF SEMICONDUCTOR DEVICE

BACKGROUND OF THE INVENTION

1. Field of the Invention

The present invention generally relates to manufacturing methods of semiconductor devices, and more specifically, to a manufacturing method of a semiconductor device wherein a transparent member is provided above a light receiving part provided on a main surface of a semiconductor element.

2. Description of the Related Art

A solid-state image sensing device formed by packaging and modularizing a solid-state image sensor with a transparent member such as glass, a wiring board, wiring connecting the solid-state image sensor and the wiring board, sealing resin, and others, is well-known. Here, the solid-state image sensing device is, for example, an image sensor such as a Charge Coupled Device (CCD) or a Complementary Metal Oxide Semiconductor (CMOS).

In such a solid-state image sensing device, if a foreign body such as dust is situated on a light receiving surface of the solid-state image sensor, the foreign body blocks incident light so that the foreign body is reflected in a monitor picture as a black point.

Because of this, it is attempted to manufacture the solid-state image sensing device in a clean room in order to prevent entry of foreign bodies. However, it is difficult to realize the perfect situation. Hence, a structure is applied where a surface protection transparent member such as glass is provided above the light receiving surface of the solid-state image sensor so that the light receiving surface of the solid-state image sensor is sealed in an initial step of a manufacturing process of the solid-state image sensing device.

FIG. 1 is a first view showing a manufacturing process of a related art solid-state image sensing device. FIG. 2 is a second view showing the manufacturing process of the related art solid-state image sensing device.

While the subject of such a manufacturing process is a semiconductor wafer on which plural solid-state image sensors are formed, a single solid-state image sensor is illustrated in FIG. 1 and FIG. 2. Illustrations of other solid-state image sensing elements situated in the periphery of this solid-state image sensor are omitted in FIG. 1 and FIG. 2.

Referring to FIG. 1, a back grinding process is applied to a rear surface of a semiconductor wafer 100 having a surface (main surface) where plural image sensors are formed via a designated wafer process. At this time, the surface of the semiconductor wafer 100 where a light receiving element area 2 is formed is protected by a BG (Back Grinding) tape 3. In this state, the rear surface of the semiconductor wafer 100 is ground (See FIG. 1-(A).

On the other hand, a glass plate 4 is prepared as a transparent member for protecting the light receiving element area 2.

A large-sized glass plate is adhered to a dicing tape 5 and pieces of the large-sized glass plate are made by a cutting method using a blade so that the glass plate 4 is made (See FIG. 1-(B)).

After that, while the BG tape 3 shown in FIG. 1-(A) adhered on the surface of the semiconductor wafer 1 is removed, the dicing tape 5 is adhered on the rear surface of the semiconductor wafer 100 (See FIG. 1-(C)).

Next, a transparent adhesive 6 is selectively applied on the light receiving element area 2 in the image sensors on the upper surface of the semiconductor wafer 100 (See FIG. 1-(D)).

Then, the glass pate 4 being large sized is removed from the dicing tape 5 so as to be mounted above the light receiving element area 2 in the image sensor of the semiconductor wafer 100 via the transparent adhesive 6 (See FIG. 1-(E)). This process is applied to a good semiconductor chip of the semiconductor wafer 100.

After that, a dicing process is applied so that the semiconductor wafer 100 is diced into pieces. As a result of this a semiconductor chip 1 that is an image sensor is formed (See FIG. 2-(F)).

The semiconductor chip 1 is die bonded on a supporting substrate (wiring board) 7 via die application material 8 (FIG. 2-(G)). An electrode terminal 9 of the semiconductor chip 1 is connected to an electrode terminal 11 of the supporting substrate 7 by a bonding wire 10 (FIG. 2-(H)).

After that, the semiconductor chip 1, the bonding wire 10, and others except an upper part of the glass plate 4, are sealed by sealing resin 12 (See FIG. 2-(I))

Then, a solder ball as an outside connection terminal 13 is provided on a rear surface of the supporting substrate 7, so that a solid-state image sensing device 14 is completed (See FIG. 2-(J)).

Modified examples of the manufacturing processes discussed with reference to FIG. 1 and FIG. 2 have been suggested.

FIG. 3 is a view showing a first modified example of the manufacturing process shown in FIG. 1 and FIG. 2. FIG. 4 is a view showing a second modified example of the manufacturing process shown in FIG. 1 and FIG. 2.

In the first modified example shown in FIG. 3, a large-sized glass plate 4' having an area equal to or greater than the area of the semiconductor wafer 100 is mounted and fixed above the semiconductor wafer 100 (See FIG. 3-(E')).

Next, a dicing process is applied to the glass plate 4' and the semiconductor wafer 100 in a lump for making pieces so that the semiconductor chip 1 is formed (See FIG. 3-(F')-(1)).

After that, only the glass plate 4' is cut so as to have a designate size corresponding to the light receiving element area 2 by applying the dicing process again (See FIG. 3-(F')-(2)).

On the other hand, in the second modified example shown in FIG. 4, after the large-sized glass plate 4' having an area equal to or greater than the area of the semiconductor wafer 100 is mounted and fixed above the semiconductor wafer 100, a dicing process is applied to only the glass plate 4' so that the glass plate 4' is cut into a designated size corresponding to the light receiving element area 2 (See FIG. 4-(F'')-(1)) and then the semiconductor wafer 100 is divided for making the pieces of the semiconductor chips 1 (See FIG. 4-(F'')-(2)). See in Japanese Laid-Open Patent Application Publication No. 2004-172249 and Japanese Laid-Open Patent Application Publication No. 2004-296738.

Thus, in the manufacturing methods shown in FIG. 1 and FIG. 2, the transparent adhesive 6 is selectively applied on the light receiving element areas of plural semiconductor chips of the semiconductor wafer 100 so that the glass plate 4 being of large size is mounted by using the transparent adhesive 6. See FIG. 1-(D) and FIG. 1-(E).

Since this process is implemented in a semiconductor chip unit, the number of processes is increased. This tendency is remarkable when the size of the semiconductor chip 1 is small.

In addition, since the glass plate 4 is provided above the light receiving element area on the surface of the semiconductor chip 1, a manufacturing apparatus and method having high positioning precision are required.

In order to prevent position shift of the glass plate 4 after the glass plate 4 is mounted, it is necessary to control the amount of the transparent adhesive 6 applied to the surface of the semiconductor wafer 100. In addition, voids should not be contained in the applied transparent adhesive 6.

If it is attempted to solve the above-mentioned problems in the manufacturing processes shown in FIG. 1 and FIG. 2, the manufacturing cost for the solid-state image sensing device 14 may increase.

On the other hand, in the manufacturing process shown in FIG. 3, while the above-mentioned problems of the manufacturing processes shown in FIG. 1 and FIG. 2 may be solved, since the dicing process is applied to plural different kinds of materials, glass plate 4' and the semiconductor wafer 100 in the same step, the processing quality may be degraded.

If the processing speed is decreased in order to prevent this, the processing ability may be degraded.

Furthermore, in a process for dicing only the glass plate 4', the transparent adhesive 6 is not provided in the vicinity of the end part of the glass plate 4' so that the process is unstable and implemented where there is no support. Hence, the processing quality may be degraded.

In addition, in the process for dicing only the glass plate 4', if the transparent resin 6 is spread to the outside of an area where the transparent resin should be provided, the transparent adhesive 6 is cut together with the glass plate 4'. Therefore, the dicing blade may become clogged due to the transparent adhesive so that unnecessary cracks may be formed in the glass plate 4'.

Furthermore, in the manufacturing process shown in FIG. 4, first the dicing process is applied to only the glass plate 4' (See FIG. 4-(F''')-(1)) and then the semiconductor wafer 100 is divided so that pieces of the semiconductor chips 1 are made (See FIG. 4-(F''')-(2)).

Therefore, it is necessary to prepare both the dicing blade for cutting the glass plate 4' and the dicing blade for cutting the semiconductor wafer 100 and process them in separated steps. Hence, the number of steps may be increased.

SUMMARY OF THE INVENTION

Accordingly, the present invention may provide a novel and useful manufacturing method of a semiconductor device solving one or more of the problems discussed above.

Another and more specific object of the present invention may be to provide a manufacturing method of a semiconductor device whereby the semiconductor device can be manufactured in a simple process without degradation of quality of the semiconductor device or processing ability.

The above object of the present invention is achieved by a manufacturing method of a semiconductor device, including: i) a step of providing a transparent member above a main surface of a semiconductor substrate where a plurality of semiconductor elements is formed; ii) a first dividing step of dividing the transparent member corresponding to a designated area of the semiconductor element; iii) a second dividing step of dividing the transparent member corresponding to an external configuration of the semiconductor element; and iv) a dividing step of dividing the semiconductor substrate into the semiconductor elements corresponding to a dividing position of the transparent member.

The above object of the present invention is achieved by a manufacturing method of a semiconductor device, the semiconductor device having a structure where a transparent member is provided above a semiconductor element, the manufacturing method including: i) a transparent member providing step of providing the transparent member having a size equal to or greater than an effective area of a semiconductor wafer, above the effective area of the semiconductor wafer; and ii) a piece making step of making pieces of the transparent member and the semiconductor wafer by applying a chemical process to a part of the transparent member and a part of the semiconductor wafer after the transparent member providing step.

According to the present invention, it is possible to provide the manufacturing method of the semiconductor device whereby the semiconductor device can be manufactured in a simple process without degradation of quality of the semiconductor device or processing ability.

Other objects, features, and advantages of the present invention will be come more apparent from the following detailed description when read in conjunction with the accompanying drawings.

BRIEF DESCRIPTION OF THE DRAWINGS

FIG. 10 is a first view showing a manufacturing process of the solid-state image sensing device of the second embodiment of the present invention;

FIG. 12 is a third view showing a manufacturing process of the solid-state image sensing device of the second embodiment of the present invention.

DETAILED DESCRIPTION OF THE PREFERRED EMBODIMENTS

A description is given below, with reference to the FIG. 5 through FIG. 12 of embodiments of the present invention.

In the following explanation, a manufacturing method of a solid-state image sensing device is discussed as an example of the present invention.

First Embodiment

The first embodiment of the present invention is discussed with reference to FIG. 5 through FIG. 8.

Figure 1:
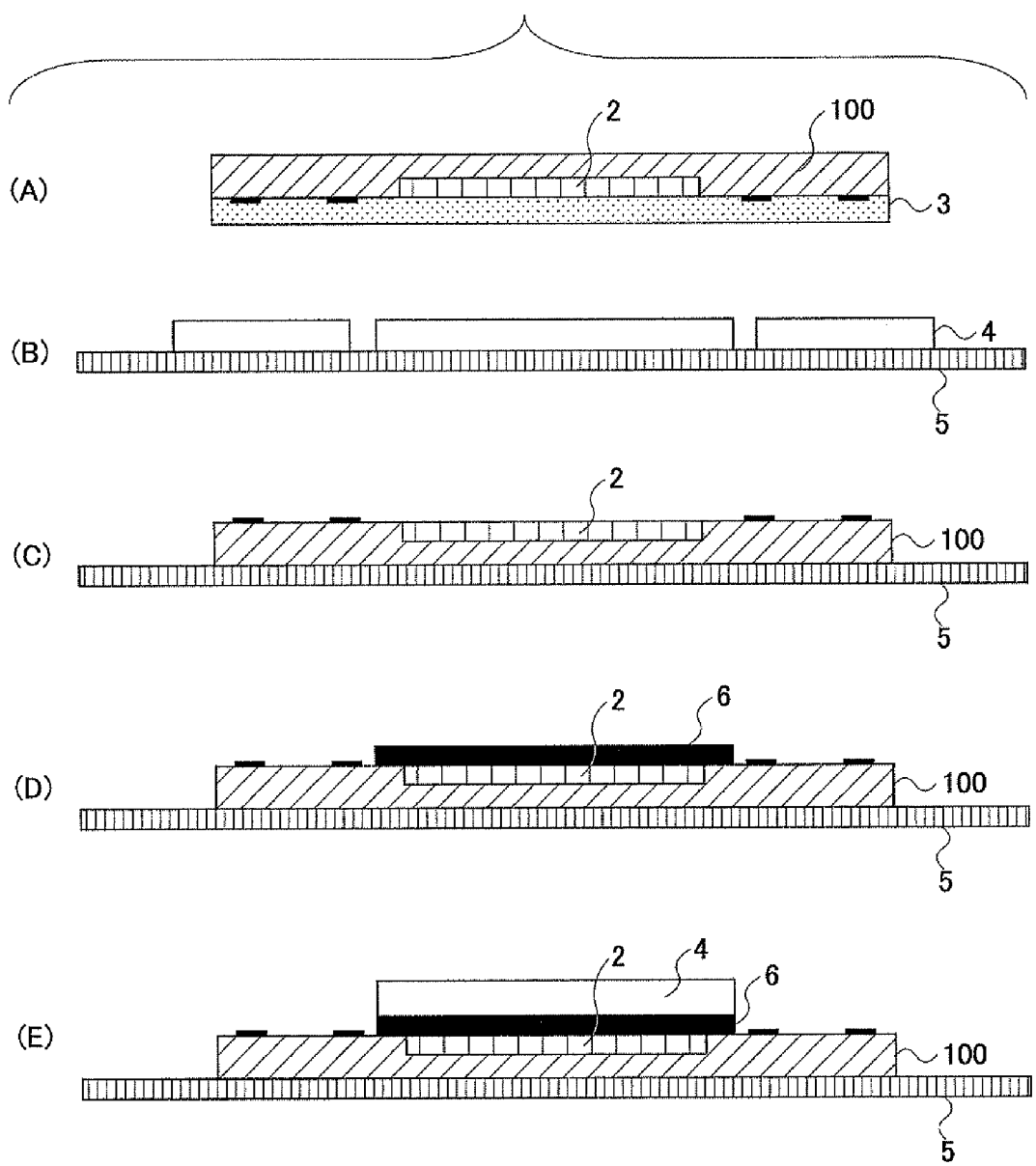
FIG. 1 is a first view showing a manufacturing process of a related art solid-state image sensing device.
Figure 2:
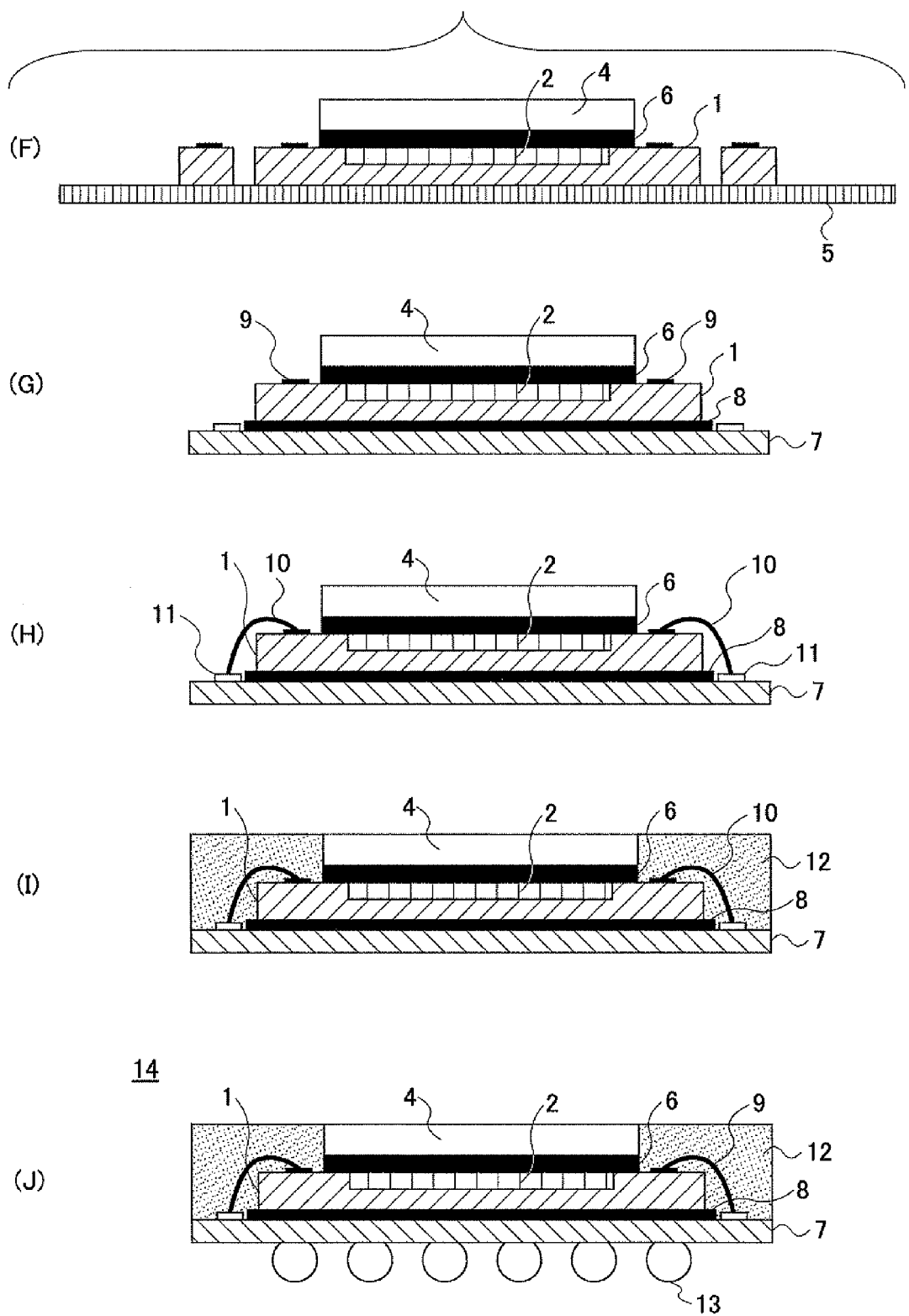
FIG. 2 is a second view showing the manufacturing process of the related art solid-state image sensing device.
Figure 3:
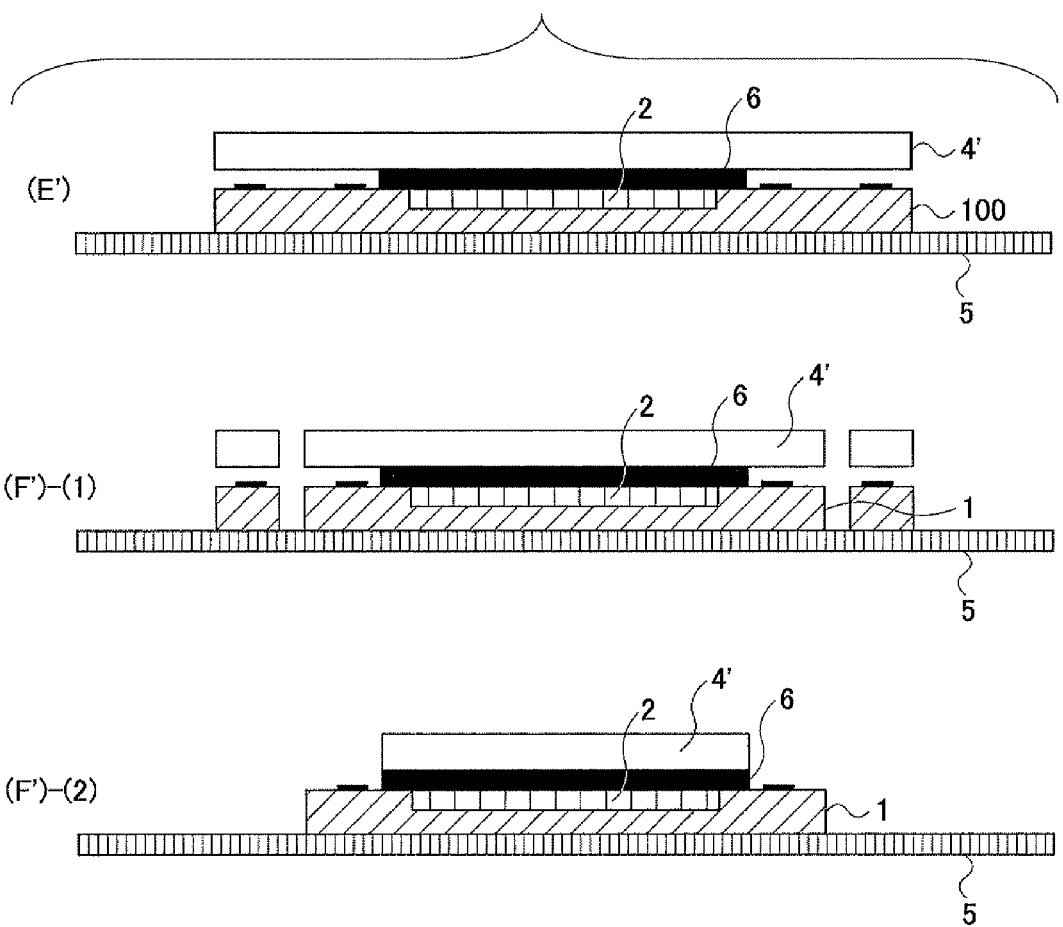
FIG. 3 is a view showing a first modified example of the manufacturing process shown in FIG. 1 and FIG. 2.
Figure 4:
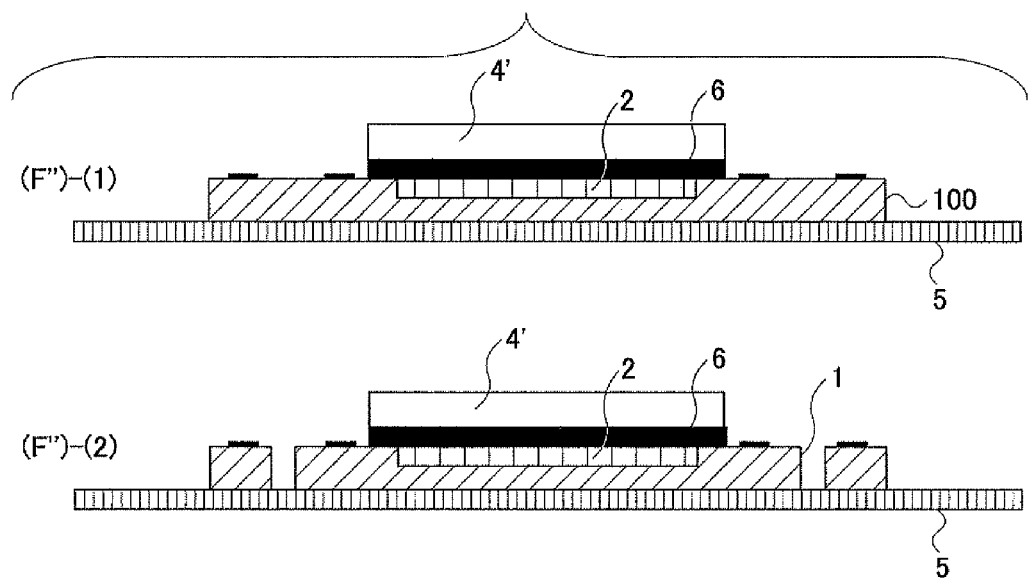
FIG. 4 is a view showing a second modified example of the manufacturing process shown in FIG. 1 and FIG. 2.
Figure 5:
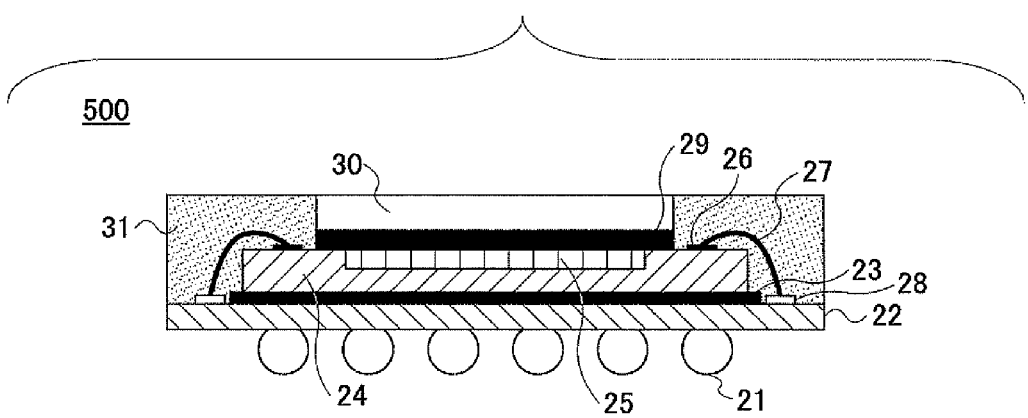
FIG. 5 is a cross-sectional view of a solid-state image sensing device manufactured according to a first embodiment of the present invention.

FIG. 5 is a cross-sectional view of a solid-state image sensing device 500 manufactured according to the first embodiment of the present invention.

Figure 6:
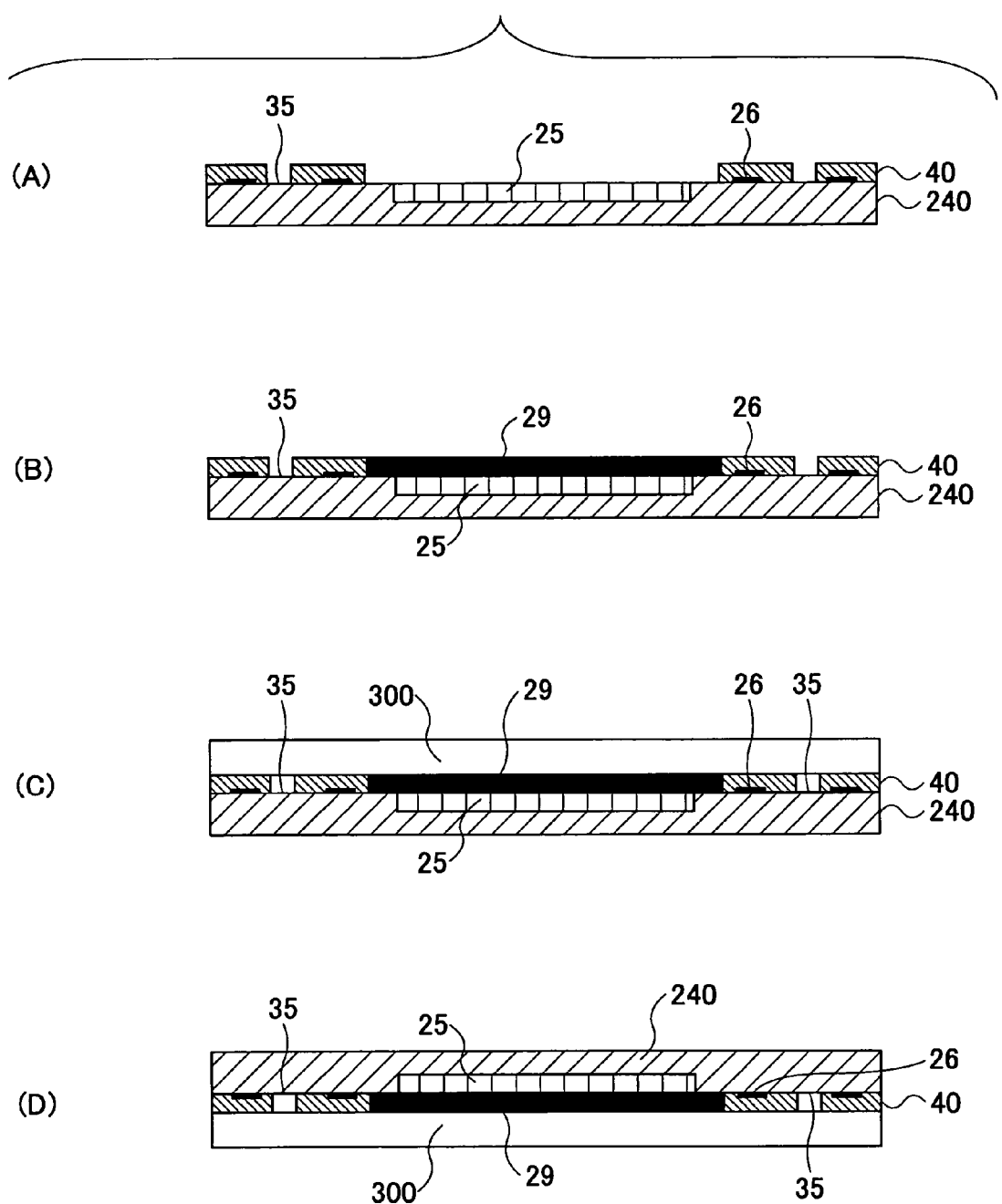
FIG. 6 is a first view showing a manufacturing process of the solid-state image sensing device of the first embodiment of the present invention.
Figure 7:
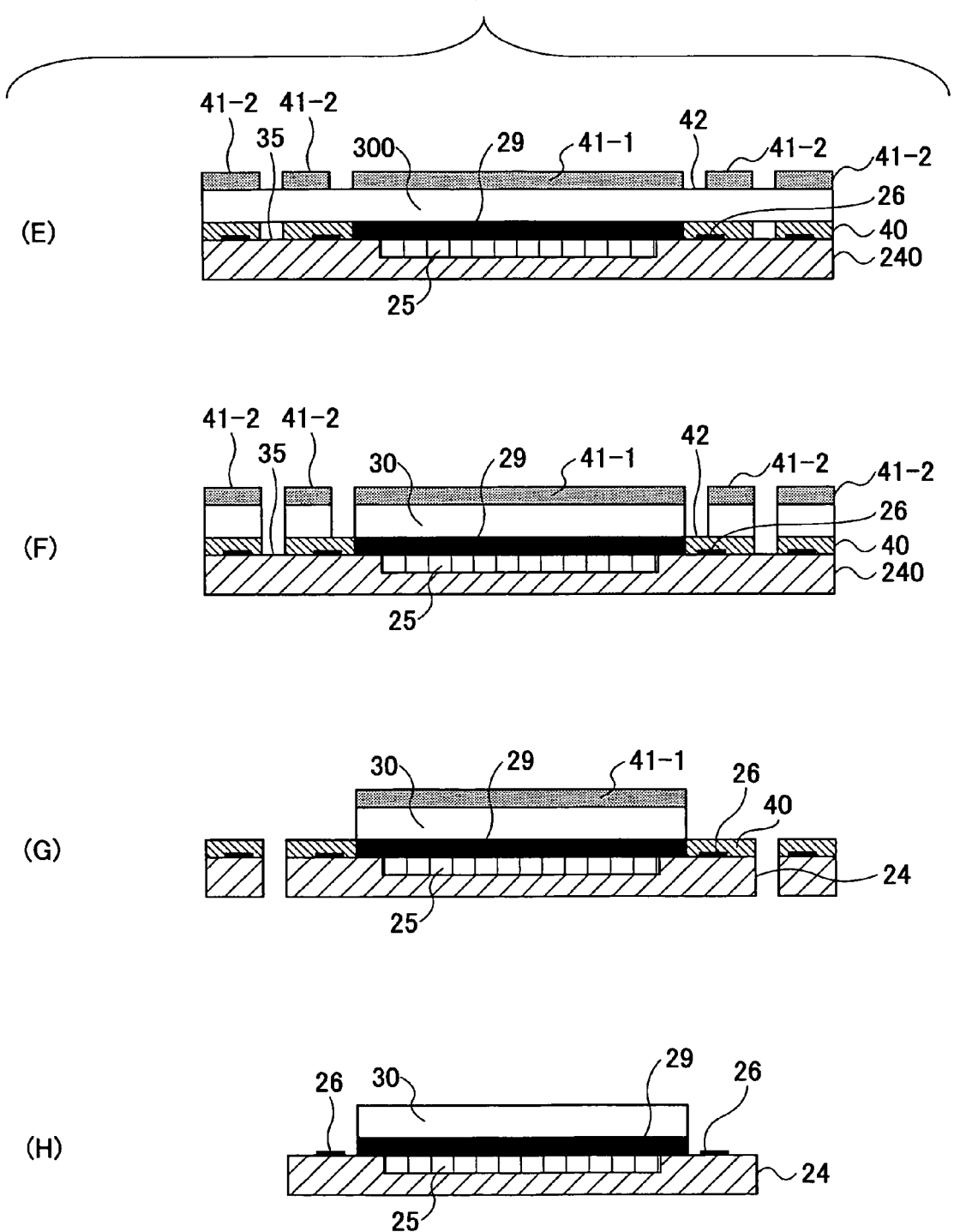
FIG. 7 is a second view showing a manufacturing process of the solid-state image sensing device of the first embodiment of the present invention.
Figure 8:
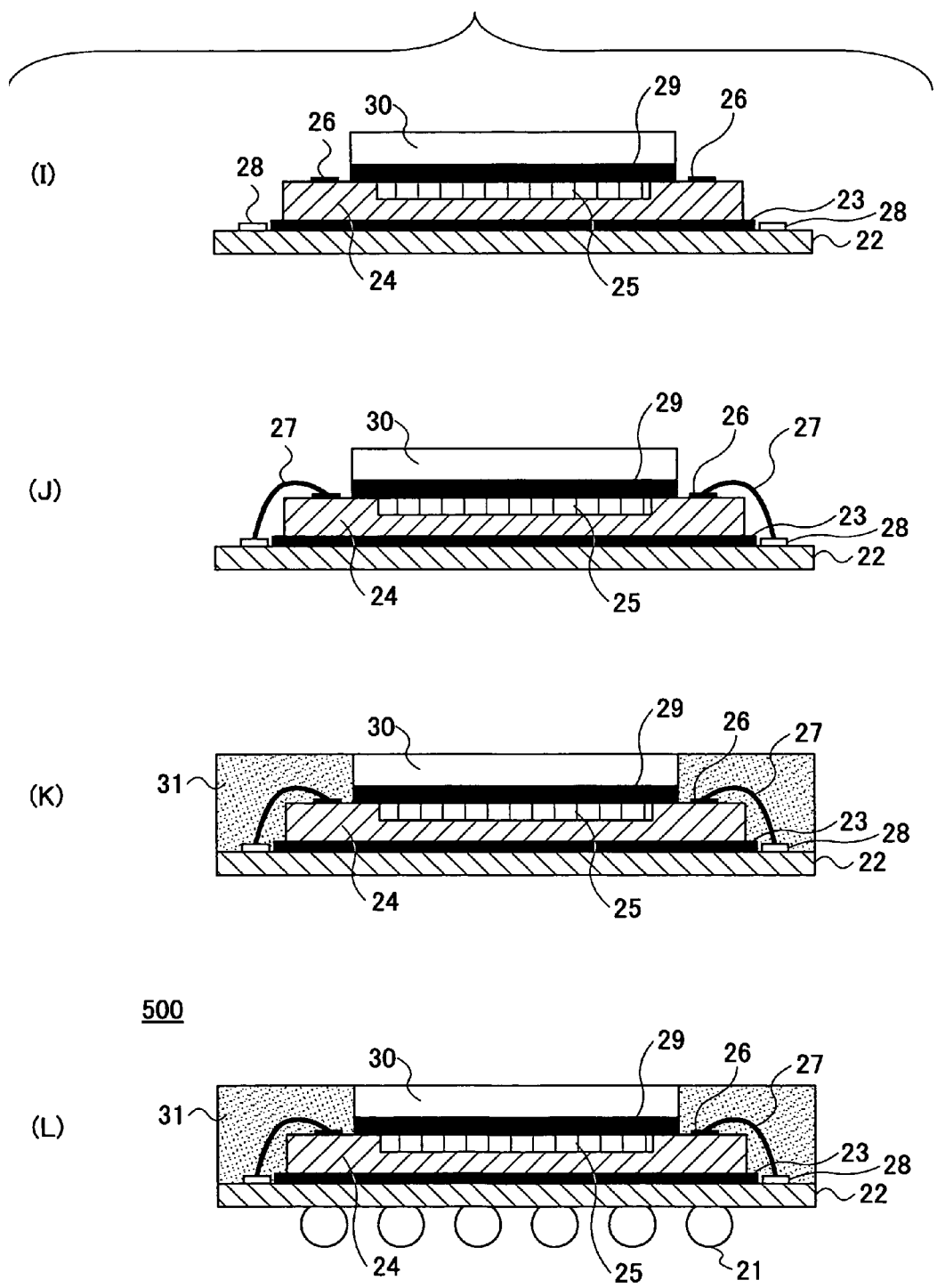
FIG. 8 is a third view showing a manufacturing process of the solid-state image sensing device of the first embodiment of the present invention.

FIG. 6 is a first view showing a manufacturing process of the solid-state image sensing device of the first embodiment of the present invention. FIG. 7 is a second view showing a manufacturing process of the solid-state image sensing device of the first embodiment of the present invention. FIG. 8 is a third view showing a manufacturing process of the solid-state image sensing device of the first embodiment of the present invention. The processes shown in FIG. 6 through FIG. 8 are a continuous process.

Referring to FIG. 5, in a solid-state image sensing device 500 manufactured by the first embodiment of the present invention, a solid-state image sensor 24 is mounted on a wiring board 22 via die application material 23. Plural outside connection terminals 21 are provided on a lower surface of the wiring board 22.

A light receiving element area 25 is formed on an upper surface of the solid-state image sensor 24. The light receiving element area 25 includes plural light receiving elements formed on a surface area of a semiconductor substrate and a micro lens provided on the light receiving elements. An outside connection terminal 26 of the solid-state image sensor 24 is connected to a connection terminal 28 of the wiring board 22 by a bonding wire 27. In addition, a glass plate 30 as a transparent member is provided above the solid-state image sensor 24 via transparent adhesive 29.

An upper surface of the wiring board 22 including the solid-state image sensor 24, the bonding wires 27 and an external circumferential part of the glass plate 30 is sealed by sealing resin 31.

In other words, the solid-state image sensor 24 is sealed by the glass plate 30 and the sealing resin 31 so that the solid-state image sensing device 500 is formed.

The solid-state image sensing device 500 is manufactured by processes discussed with reference to FIG. 6 through FIG. 8.

While the subject of the process shown in FIG. 6 through FIG. 8 is a semiconductor substrate (semiconductor wafer) where plural solid-state image sensors are formed, a single solid-state image sensor and its periphery part are illustrated in FIG. 6 through FIG. 8. Although other solid-state image sensors exist in the periphery of the solid-state image sensor, illustration of the sensors are omitted in FIG. 6 through FIG. 8.

First, a first resist layer 40 is selectively formed, as seen in FIG. 6-(A), on a semiconductor wafer 240, which wafer 240 has a main surface where plural solid-state image sensors are formed, via a designated wafer process.

The first resist layer 40 has a pattern where areas corresponding to the light receiving element area 25 and a wafer piece-making line 35 discussed below are opened (not covered).

As the first resist layer 40, a liquid resist or a film resist can be used. It is preferable that the resist have a thickness of 5 through 15 μm. The thickness of the resist layer 40 is selected so that a desired thickness of the adhesive 29 formed on the semiconductor wafer 240 in the next step can be achieved.

Next, the transparent adhesive 29 is applied on the light receiving element area 25 of the semiconductor wafer 240 as shown in FIG. 6-(B) (Adhesive member providing process).

Here, the first resist layer 40 works as a dam so that the transparent adhesive 29 is prevented from flowing out to an area other than the area where the transparent adhesive 29 is applied.

Therefore, not only an adhesive having a viscosity of approximately 10 through 50 Pa·S but also an adhesive having a viscosity equal to or less than 1 Pa·S can be applied as the transparent adhesive 29 so that a void is not generated and efficiency of an application process can be improved.

The transparent adhesive 29 may be selectively applied by using a dispenser or the like. Furthermore, the amount (thickness) of the transparent adhesive 29 can be controlled by controlling the thickness of the first resist layer 40.

In addition, thermosetting epoxy resin, ultraviolet curing resin, or both thermosetting resin and ultraviolet curing resin can be used as the transparent adhesive 29 as following a property of the solid-state image sensing device 500.

Next, a glass plate 300 having an area equal to or greater than an effective area of the semiconductor wafer 240 is mounted above the semiconductor wafer 240 and fixed to the semiconductor wafer 240 by the transparent adhesive 29, as shown in FIG. 6-(C) (Transparent member providing step).

Here, the effective area of the semiconductor wafer is defined as an area formed on the semiconductor wafer where the solid-state image sensor functions.

The glass plate 300 is provided so as to cover upper parts of the first resist layer 40 and the transparent adhesive 29.

There is no limitation on the configuration of the glass plate 300. The configuration of the glass plate 300 may correspond to the external configuration of the semiconductor wafer 240 or may be a rectangular configuration. In addition, it is not necessary for the glass plate 300 to have the same size as the semiconductor wafer 240 as long as the glass plate 300 has an area equal to or greater than the effective area.

It is preferable to implement processes for mounting and fixing the glass plate 300 under a vacuum atmosphere so that air does not enter between the glass plate 300 and the first resist layer 40 and/or the transparent adhesive 29, thereby preventing the generation of air bubbles.

If air does not enter, due to outside normal atmospheric pressure the glass plate 300 may become curved and pressed as though by a roller or the like while being adhered. The thickness of the glass plate 300 may be selected from a range of approximately 0.2 through 0.5 mm.

Because of such a process, the light receiving element area 25 on the surface of the semiconductor wafer 240 is sealed so that a foreign body such as dust is not adhered. Dust adhered on the outside surface of the glass plate 300 can be easily removed by air blowing, water washing, or the like.

Next, a back grinding process is applied to the rear surface of the semiconductor wafer 240 so that the semiconductor wafer 240 has a designated thickness as shown in FIG. 6-(D) (Rear surface grinding process).

At this time, the semiconductor wafer 240 is united with the glass plate 300 via the transparent adhesive 29 and the first resist layer 40. Therefore, while the semiconductor wafer 240 is made thin by the grinding process so that the mechanical strength of the semiconductor wafer 240 is reduced, the semiconductor wafer 240 is mechanically supported by the glass plate 300 so that the mechanical strength for realizing the solid-state image sensing device 500 is maintained. Hence, it is possible to make the solid-state image sensor small or thin.

According to this process, steps of adhering and removing back grinding tape to and from the surface of the semiconductor wafer are not required and therefore the manufacturing process can be simplified while adhesion of foreign bodies can be prevented. In addition, since the consumption of tape is not necessary, it is possible to reduce the manufacturing cost of the solid-state image sensing device.

Next, the second resist layer 41 is selectively formed on the upper surface of the glass plate 300 as shown in FIG. 7-(E).

The second resist layer 41 includes a second resist layer 41-1 and a second resist layer 41-2. The second resist layer 41-1 is provided on a surface area of the glass plate 300 corresponding to the area where the adhesive 29 is provided in the process shown in FIG. 6-(B). The second resist layer 41-2 is provided via a gap part 42 so as to be separated from the second resist layer 41-1.

The second resist layer 41-2, as well as the first resist layer 40, has a pattern where areas corresponding to the piece-making line 35 discussed below are opened.

As the second resist layer 41, a liquid resist or a film resist can be used. There is no limitation on the thickness of the second resist layer 41.

The next process can be applied where the semiconductor wafer 240 is mounted on a wafer set jig (not shown) or where a dicing tape (not shown) is adhered on the rear surface of the semiconductor wafer 240.

Next, the glass plate 300 is selectively etched by using the second resist layer 41 as a mask so that the glass plate 300 is divided and pieces 30 of the glass plate 300 are made corresponding to the image sensor (piece-making process) as shown in FIG. 7-(F).

As this etching process, a wet type etching process using chemical liquid made of a mixture of hydrofluoric acid, nitric acid, acetic acid, or the like or a dry type etching process such as anisotropic plasma etching or the like using fluoride group gas such as Sulfur Hexafluoride ($SF_6$) gas or the like can be used.

By applying the etching process using Sulfur Hexafluoride ($SF_6$) gas, the glass plate 300 is divided into an area masked by the second resist layer 41-1 and an area masked by the second resist layer 41-2.

In the area defined by the second resist layer 41-2, an area corresponding to the wafer piece-making line 35 defined by the first resist layer 40 of the semiconductor wafer 240 is exposed.

On the other hand, in the gap part 42, while the etching process is applied to the glass plate 300, the semiconductor wafer 240 is not exposed due to the first resist layer 40.

Next, the semiconductor wafer 240 is selectively etched (piece-making process) as shown in FIG. 7-(G).

By continuing the etching process using Sulfur Hexafluoride ($SF_6$) gas, etching the semiconductor wafer 240 at the wafer piece-making line 35 is done by using the first resist layer 40 as the mask, and the semiconductor wafer 240 is divided so that plural solid-state image sensors 24 are formed. In other words, etching the glass substrate 300 and etching the semiconductor wafer 240 are continuously performed.

After that, a part of the glass plate 300 unnecessary for forming the solid-state image sensing device 500, namely the part having a surface where the second resist layer 41-2 is provided, is removed by vibrating the semiconductor wafer 240 or using the vacuum suction method so that the part falls off.

Next, as shown in FIG. 7-(H), the second resist layer 41-1 on the glass plate 30 and the first resist layer 40 on the semiconductor wafer 240 (solid-state image sensor 24) are removed.

As a method for removing the second resist layer 41-1 and the first resist layer 40, a wet type melting or a dry type ashing process is applied.

As a result of this, the glass plate 30 is provided above the light receiving element area 25 so that the solid-state image sensor 24 is formed.

Next, the solid-state image sensor 24 is fixed (die bonded) on the wiring board 22 via die application material 23 (FIG. 8-(I)). An outside connection terminal 26 of the solid-state image sensor 24 is connected to a connection terminal 28 of the wiring board 22 by a bonding wire 27 (FIG. 8-(J)).

After that, the solid-state image sensor 24, the bonding wire 27, and an external circumferential side surface part of the glass plate 30 are sealed by sealing resin 31 (See FIG. 8-(K)).

Then, a solder ball as an outside connection terminal 21 is provided on a rear surface of the wiring board 22, so that a solid-state image sensing device 500 is completed (See-FIG. 8-(L)).

In a case where a large size wiring board is used as the wiring board 22 and plural solid-state image sensors 24 are formed on the wiring board 22, the outside connection terminals 21 are provided and then the sealing resin 31 and the wiring board 22 between the solid-state image sensors are cut and separated so that individual solid-state image sensing device 500 is formed.

Thus, in this embodiment, the semiconductor wafer 240 and the glass plate 300 having the same size of the semiconductor wafer 240 and fixed to the semiconductor wafer 240 are cut into pieces in a lump by a chemical process, so that the solid-state image sensing device 500 having a structure where the glass plate 30 is provided above the light receiving element area 25 is formed.

A piece-making process in a lump can be implemented by a chemical process such as etching so that the mechanical strength of the solid-state image sensor 24 can be maintained without mechanically damaging the solid-state image sensor 24.

Particularly, since the etching process of the glass plate 300 and the semiconductor wafer 240 can be implemented by applying the same etchant, it is easy to control the etching amount by controlling the etching process time.

In addition, since a process of making pieces of the glass plate 300 in advance and then mounting the piece of the glass plate 300 above the solid-state image sensor 24 is not provided, it is possible to improve manufacturing efficiency. Especially, this effect is remarkable when the chip size is small.

For example, in a case where a solid-state image sensor whose chip size is 5 mm×5 mm is formed by using a semiconductor wafer whose wafer size is 8 inches, a process of mounting approximately 1000 pieces of the glass plate is required in the conventional method. In this case, it takes approximately 3 seconds for mounting a single glass plate and therefore approximately 3000 seconds are required per each semiconductor wafer.

On the other hand, according to the embodiment of the present invention, it takes approximately 1200 seconds for the etching process for the piece-making process after the glass plate 21 and the semiconductor wafer 240 are unified. Thus, it is possible to dramatically reduce process time as compared with the conventional art.

In addition, in the embodiment of the present invention, the process of making pieces of the glass plate 300 in advance is not required. Therefore, dicing tape is not necessary. Hence, since the tape is consumption material that is not necessary, it is possible to reduce the manufacturing cost of the solid-state image sensing device. Furthermore, equipment or a jig necessary for mounting the pieces of the glass plate above the semiconductor wafer 240 is not required.

In addition, in the back grinding process of the semiconductor wafer 240 shown in FIG. 6-(D), the glass plate 300 fixed by the semiconductor wafer 240 mechanically supports the semiconductor wafer 240. Therefore, it is possible to easily grind the semiconductor wafer 240 so that the semiconductor wafer 240 is made thin, and thereby it is possible to easily make the solid-state image sensing device 500 small and thin.

Furthermore, according to this process, steps of adhering and removing the back grinding tape to and from the surface of the semiconductor wafer are not required and therefore the manufacturing process can be simplified and adhesion of foreign bodies can be prevented. In addition, since consumption of the tape is not necessary, it is possible to reduce the manufacturing cost of the solid-state image sensing device.

In addition, the transparent adhesive 29 is used for attaching the glass plate 300 to the semiconductor wafer 240. Control of the amount and quality of application of the transparent adhesive 29 can be done not in units of chips (pieces) but in units of semiconductor wafers. Hence, it is possible to improve the process efficiency.

Furthermore, the first resist layer 40 works as a dam so that the transparent adhesive 29 is prevented from flowing into an area other than the area where the adhesive 29 is applied. Therefore, since the amount of the transparent adhesive 29 can be easily controlled and an adhesive having a low viscosity can be used, it is possible to effectively prevent the generation of voids.

In addition, a liquid body such as the transparent adhesive 29 and the first resist layer 40 is adhered to a concave and convex pattern surface. Hence, entry or adhesion of foreign bodies to or on the semiconductor wafer 240 or cracks of the semiconductor wafer 240 due to concave and convex steps formed on a pattern surface of the semiconductor wafer 240 can be avoided.

Second Embodiment

The second embodiment of the present invention is discussed with reference to FIG. 9 through FIG. 12.

Figure 9:
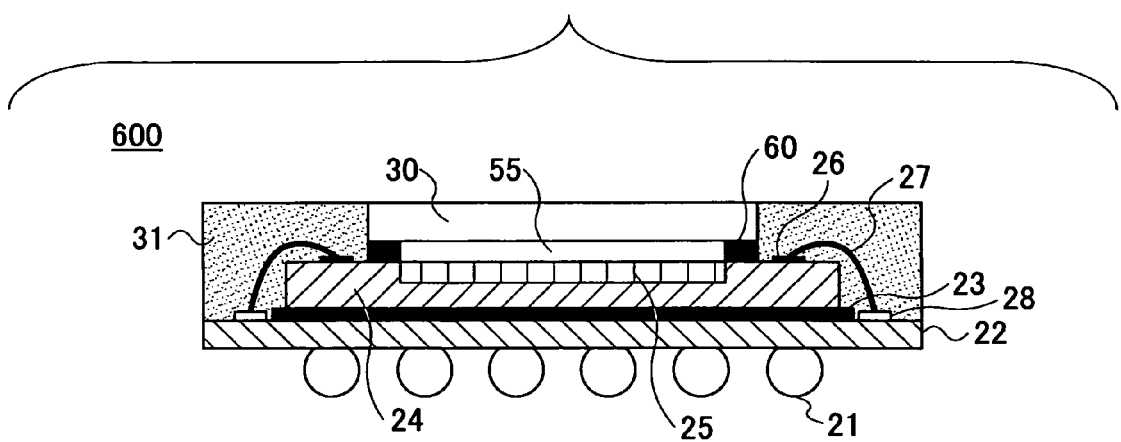
FIG. 9 is a cross-sectional view of a solid-state image sensing device manufactured according to a second embodiment of the present invention.

FIG. 9 is a cross-sectional view of a solid-state image sensing device 600 manufactured according to the second embodiment of the present invention.

Figure 11:
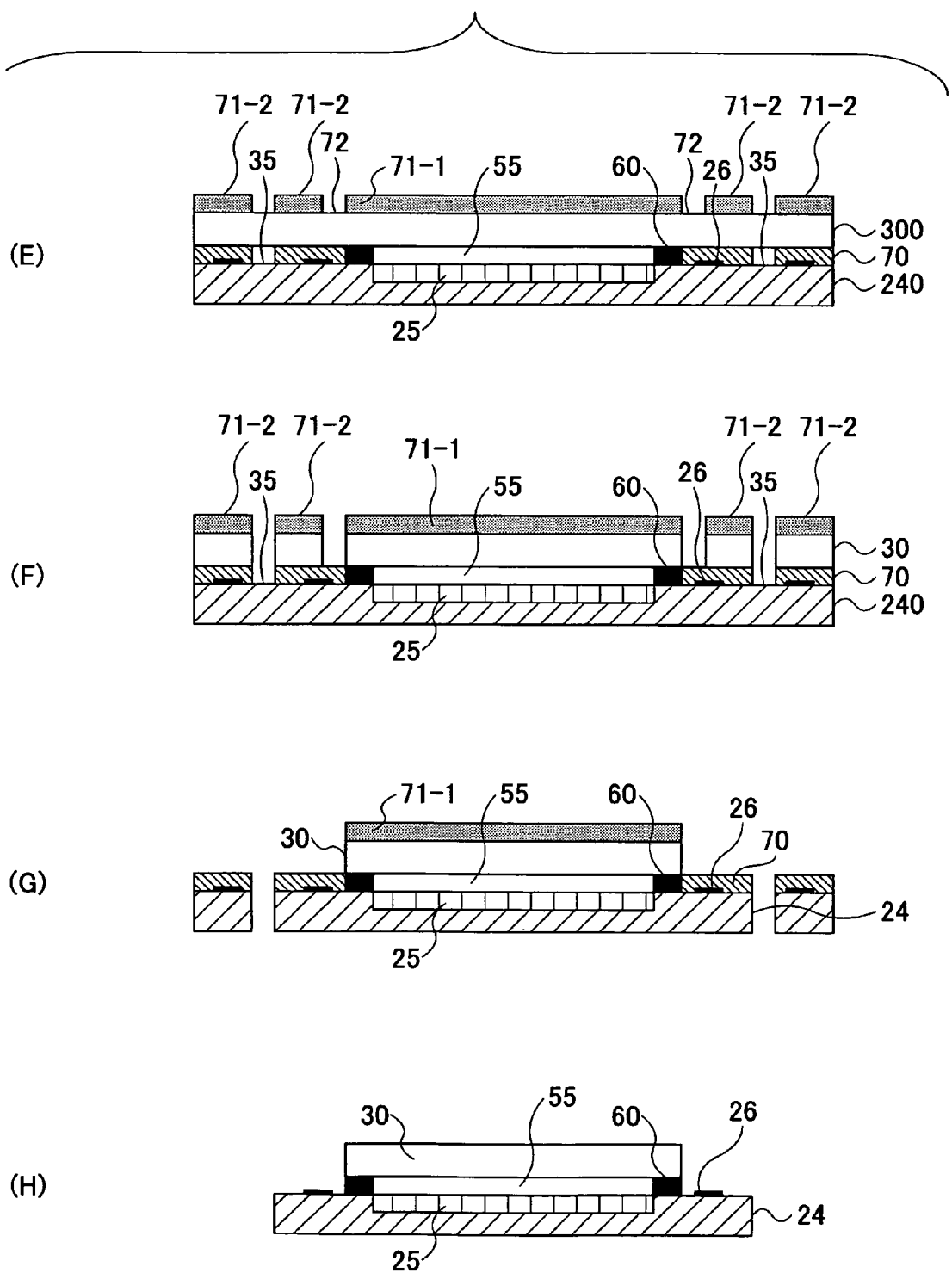
FIG. 11 is a second view showing a manufacturing process of the solid-state image sensing device of the second embodiment of the present invention.

FIG. 10 is a first view showing a manufacturing process of the solid-state image sensing device of the second embodiment of the present invention. FIG. 11 is a second view showing a manufacturing process of the solid-state image sensing device of the second embodiment of the present invention. FIG. 12 is a third view showing a manufacturing process of the solid-state image sensing device of the second embodiment of the present invention. The processes shown in FIG. 10 through FIG. 12 are a continuous process.

While the subject of the process shown in FIG. 10 through FIG. 12 is a semiconductor substrate (semiconductor wafer) where plural solid-state image sensors are formed, a single solid-state image sensor and its periphery part are illustrated in FIG. 10 through FIG. 12.

Although other solid-state image sensors exist in the periphery of the solid-state image sensor, illustration of the sensors are omitted in FIG. 10 through FIG. 12. In the second embodiment, parts that are the same as the parts of the first embodiment are given the same reference numerals, and explanation thereof is omitted.

In the solid-state image sensing device 600 of this embodiment, the glass plate 30 provided above the light receiving element area 25 of the solid-state image sensor 24 is supported by the adhesive provided in the periphery of the light receiving element area 25, so that a space forming part 55 is formed between the light receiving element area 25 and the glass plate 30.

In other words, the glass plate 30 is provided above the light receiving element area 25 via the space forming part 55 and air exists in the space forming part 55. Here, the light receiving element area 25 includes plural light receiving elements formed on a surface area of the semiconductor substrate and the micro lens provided above the light receiving element.

Therefore, the light passing through the glass plate 30 is efficiently incident on the light receiving element part due to the difference of refractive indexes of the air in the space forming part 55 and the micro lens. That is, high concentration rate of light is achieved so that an image signal having a high resolution can be obtained.

The solid-state image sensing device 600 is manufactured by processes discussed with reference to FIG. 10 through FIG. 12.

First, an adhesive tape 60 is selectively formed on a semiconductor wafer 240 which wafer has a main surface where plural solid-state image sensors are formed via a designated wafer process, as shown in FIG. 10-(A) (Adhesive member providing process).

The adhesive tape 60 has a sheet-shaped configuration wherein adhesive layers are provided on both surfaces of the adhesive tape 60. The adhesive tape 60 surrounds the light receiving element areas 25 of plural solid-state image sensors formed on the main surface of the semiconductor wafer 240. The thickness of the adhesive tape 60 is selected so that the space forming part 55 discussed below can be formed between the light receiving element area 25 and the glass plate 30 in a later process.

At this time, the adhesive tape 60 surrounding each of the light receiving element areas 25 for every solid-state image sensor may be adhered. Alternatively, a large-sized adhesive tape may be manufactured in advance and then adhered to the semiconductor wafer 240. Here, the large-sized adhesive tape has the substantially same size as that of the semiconductor wafer 240, covers plural solid-state image sensors formed on the semiconductor wafer 240, and has an opening corresponding to the light receiving element area 25 on the solid-state image sensor.

Next, a first resist layer 70 is selectively formed so that the semiconductor wafer area positioned outside of the adhesive tape 60 is covered as shown in FIG. 10-(B).

The first resist layer 70, in a semiconductor wafer area situated outside of the adhesive tape 60, has a pattern where areas corresponding to the light receiving element area 25 and a wafer piece-making line 35 discussed below are opened.

As the first resist layer 70, a liquid resist or a film resist can be used. It is preferable that the resist have thickness equal to the thickness of the adhesive tape 60.

Next, a glass plate 300 having an area equal to or greater than an effective area of the semiconductor wafer 240 is mounted above the semiconductor wafer 240 and fixed to the semiconductor wafer 240 by the adhesive tape 60, as shown in FIG. 10-(C) (Transparent member providing step).

Here, the effective area of the semiconductor wafer is defined as an area formed on the semiconductor wafer where the solid-state image sensor functions.

The glass plate 300 is provided so as to cover upper parts of the first resist layer 70 and the adhesive tape 60.

There is no limitation on a configuration of the glass plate 300. The configuration may correspond to an external configuration of the semiconductor wafer 240 or may be a rectangular configuration. In addition, it is not necessary for the glass plate 300 to have the same size as the semiconductor wafer 240 as long as the glass pate 300 has an area equal to or greater than the effective area.

As a result of the transparent member providing step, the space forming part 55 is formed between the glass plate 21 and the light receiving element area 29.

After this, processes similar to the processes in the first embodiment of the present invention are applied. That is, next, a back grinding process is applied to the rear surface of the semiconductor wafer 240 so that the semiconductor wafer 240 has a designated thickness as shown in FIG. 10-(D).

At this time, the semiconductor wafer 240 is united with the glass plate 300 via the adhesive tape 60 and the first resist layer 70. Therefore, while the semiconductor wafer 240 is made thin by the grinding process so that the mechanical strength of the semiconductor wafer 240 is reduced, the semiconductor wafer 240 is mechanically supported by the glass plate 300 so that the mechanical strength for realizing the solid-state image sensing device 600 is maintained. Hence, it is possible to make the solid-state image sensor small or thin.

According to this process, steps of adhering and removing the back grinding tape to and from the surface of the semiconductor wafer 240 are not required and therefore the manufacturing process can be simplified and adhesion of foreign bodies can be prevented. In addition, since consumption of the tape material is not necessary, it is possible to reduce the manufacturing cost of the solid-state image sensing device.

Next, the second resist layer 71 is selectively formed on the upper surface of the glass plate 300 as shown in FIG. 11-(E).

The second resist layer 71 includes a second resist layer 71-1 and a second resist layer 71-2. The second resist layer 71-1 is provided on a surface area of the glass plate 300 corresponding to the area where the adhesive tape 60 is provided in the process shown in FIG. 11-(B). The second resist layer 71-2 is provided via a gap part 72 so as to be separated from the second resist layer 71-1.

The second resist layer 71-2, as well as the first resist layer 70, has a pattern where areas corresponding to the piece-making line 35 discussed below are opened.

As the second resist layer 71, a liquid resist or a film resist can be used. There is no limitation on the thickness of the second resist layer 71.

Next, the glass plate 300 is selectively etched by using the second resist layer 71 as a mask so that the glass plate 300 is divided and pieces 30 of the glass plate 300 are made corresponding to the image sensor (piece-making process) as shown in FIG. 11-(F).

As this etching process, a wet type etching process using chemical liquid made of a mixture of hydrofluoric acid, nitric acid, acetic acid, or the like or a dry type etching process such as anisotropic plasma etching or the like using fluoride group gas such as Sulfur Hexafluoride ($SF_6$) gas or the like can be used.

By applying the etching process using Sulfur Hexafluoride ($SF_6$) gas, the glass plate 300 is divided into an area masked by the second resist layer 71-1 and an area masked by the second resist layer 71-2.

In the area defined by the second resist layer 71-2, an area corresponding to the wafer piece-making line 35 defined by the first resist layer 70 of the semiconductor wafer 240 is exposed.

On the other hand, in the gap part 72, while the etching process is applied to the glass plate 300, the semiconductor wafer 240 is not exposed due to the first resist layer 70.

Next, the semiconductor wafer 240 is selectively etched (piece-making process) as shown in FIG. 11-(G).

By continuing the etching process using Sulfur Hexafluoride ($SF_6$) gas, etching the semiconductor wafer 240 at the wafer piece-making line 35 is performed by using the first resist layer 70 as the mask, and the semiconductor wafer 240 is divided so that plural solid-state image sensors 24 are formed. In other words, etching the glass substrate 300 and etching the semiconductor wafer 240 are continuously performed.

After that, a part unnecessary for forming the solid-state image sensing device 600 of the glass plate 300, namely a part having a surface where the second resist layer 71-2 is provided, is removed by vibrating the semiconductor wafer 240 or vacuum suction so that the part is removed.

Next, as shown in FIG. 11-(H), the second resist layer 71-1 on the glass plate 30 and the first resist layer 70 on the semiconductor wafer 240 (solid-state image sensor 28) are removed.

As a method for removing the second resist layer 71-1 and the first resist layer 70, a wet type melting or a dry type ashing process is applied.

As a result of this, the glass plate 30 is provided above the light receiving element area 25 so that the solid-state image sensor 24 is formed.

Next, the solid-state image sensor 24 is fixed (die bonded) on the wiring board 22 via die application material 23 (FIG. 12-(I)). An outside connection terminal 26 of the solid-state image sensor 24 is connected to a connection terminal 28 of the wiring board 22 by a bonding wire 27 (FIG. 11-(J))

After that, the solid-state image sensor 24, the bonding wire 27, and an external circumferential side surface part of the glass plate 30 are sealed by sealing resin 31 (See FIG. 11-(K)).

Then, a solder ball as an outside connection terminal 21 is provided on a rear surface of the wiring board 22, so that a solid-state image sensing device 600 is completed (See FIG. 11-(L)).

In a case where a large size wiring board is used as the wiring board 22 and plural solid-state image sensors 24 are formed on the wiring board 22, the outside connection terminals 21 are provided and then the sealing resin 30 and the wiring board 22 between the solid-state image sensors are cut and separated so that individual solid-state image sensing device 600 is formed.

Thus, in this embodiment, the same effect as the effect of the first embodiment of the present invention is achieved. Without degradation of quality and/or processing ability, with a simple process, it is possible to manufacture the solid-state image sensing device 600 having the space forming part 55 formed between the lower surface of the glass plate 30 and the light receiving element surface 25.

The present invention is not limited to these embodiments, but variations and modifications may be made without departing from the scope of the present invention.

For example, in the above-discussed embodiments, the solid-state image sensing device is explained as an example of the semiconductor device of the present invention, and the solid-state image sensor is explained as an example of the semiconductor element forming the semiconductor device of the present invention. However, the present invention is not limited to this. The semiconductor element is not limited to the solid-state image sensor such as an image sensor but may be, for example, a fingerprint sensor using glass. In addition, the present invention can be applied to a semiconductor device such as an optical module or Erasable Programmable Read Only Memory (EPROM).

This patent application is based on Japanese Priority Patent Application No. 2006-41025 filed on Feb. 17, 2006, the entire contents of which are hereby incorporated by reference.

What is claimed is:

1. A manufacturing method of a semiconductor device, comprising:
   a step of providing a transparent member above a main surface of a semiconductor substrate where a plurality of semiconductor elements are formed;
   a first dividing step of dividing the transparent member corresponding to a designated area of the semiconductor element;
   a second dividing step of dividing the transparent member corresponding to an external configuration of the semiconductor element; and
   a dividing step of dividing the semiconductor substrate into the semiconductor elements corresponding to a dividing position of the transparent member,
   wherein the second dividing step of dividing the transparent member and the dividing step of dividing the semiconductor substrate are continuously implemented;
   a same dry type etching method is used in the second dividing step of dividing the transparent member and in the dividing step of dividing the semiconductor substrate;
   the same chemical is used for the etching of the transparent member and the etching of the semiconductor substrate; and
   pieces of the transparent member and the semiconductor substrate are formed, by controlling an etching time so that an etching amount is controlled.

2. The manufacturing method of the semiconductor device as claimed in claim 1,
   wherein an area of the transparent member is equal to or greater than an effective area of the semiconductor substrate.

3. The manufacturing method of the semiconductor device as claimed in claim 1,
   wherein the first dividing step and the second dividing step of the transparent member are implemented at the same time.

4. The manufacturing method of the semiconductor device as claimed in claim 1,
   wherein a designated area of the semiconductor element is a light receiving area.

5. The manufacturing method of the semiconductor device as claimed in claim 1, further comprising:
   a grinding step of a rear surface of the semiconductor substrate where the transparent member functions as a base after the step of providing the transparent member above the main surface of the semiconductor substrate.

* * * * *